(12) United States Patent
Hung et al.

(10) Patent No.: US 8,829,936 B2
(45) Date of Patent: Sep. 9, 2014

(54) PROBE CARD STRUCTURE ADAPTABLE TO DIFFERENT TEST APPARATUSES OF DIFFERENT SPECIFICATIONS

(75) Inventors: Chien-Yao Hung, Hsinchu (TW); Chih Yao Chen, Hsinchu (TW)

(73) Assignee: Hermes-Epitek Corp., Taipei (TW)

( * ) Notice: Subject to any disclaimer, the term of this patent is extended or adjusted under 35 U.S.C. 154(b) by 480 days.

(21) Appl. No.: 13/115,148

(22) Filed: May 25, 2011

(65) Prior Publication Data

US 2012/0049878 A1  Mar. 1, 2012

(30) Foreign Application Priority Data

Aug. 31, 2010 (TW) ................................ 99129378 A

(51) Int. Cl.
*G01R 31/00* (2006.01)
*G01R 31/28* (2006.01)

(52) U.S. Cl.
CPC ........ *G01R 31/2887* (2013.01); *G01R 31/2889* (2013.01)
USPC ................................. 324/756.02; 324/756.03

(58) Field of Classification Search
CPC ........................ G01R 31/2887; G01R 31/2889
USPC .............. 324/756.02, 754.01–754.11, 754.21
See application file for complete search history.

(56) References Cited

U.S. PATENT DOCUMENTS

| 7,750,657 B2 * | 7/2010 | Schmidt et al. .......... 324/754.07 |
| 2007/0290699 A1 * | 12/2007 | Mochizuki et al. ............ 324/754 |
| 2010/0148811 A1 * | 6/2010 | Cho et al. ....................... 324/754 |

\* cited by examiner

*Primary Examiner* — Arleen M Vazquez
*Assistant Examiner* — Alesa Allgood
(74) *Attorney, Agent, or Firm* — Rosenberg, Klein & Lee

(57) ABSTRACT

A probe card structure adaptable to different test apparatuses of different specifications includes a probe card adapted to a first specification, a reinforcement member adapted to a second specification and a specification conversion interface unit disposed between the probe card and the reinforcement member. The probe card without the specification conversion interface unit can be directly mounted on a test apparatus of the first specification by means of a reinforcement member of the first specification to carry out the test process. Alternatively, the specification conversion interface unit can be combined with the probe card to convert the probe card from the first specification to the second specification. Accordingly, the probe card of the second specification can be mounted on a test apparatus of the second specification by means of the reinforcement member of the second specification to carry out the test process.

34 Claims, 6 Drawing Sheets

PROBE CARD STRUCTURE ADAPTABLE TO DIFFERENT TEST APPARATUSES OF DIFFERENT SPECIFICATIONS

BACKGROUND OF THE INVENTION

1. Field of the Invention

The present invention relates generally to a probe card structure adaptable to different test apparatuses of different specifications, and more particularly to a probe card structure adaptable to different test apparatuses of different specifications for testing integrated circuits.

2. Description of the Related Art

FIG. 1 shows a conventional probe card structure mounted on an integrated circuit test apparatus. The probe card structure mainly includes a layout circuit board 1, a fastener ring 2, a probe retainer unit 3 and a reinforcement member 4 for securing the layout circuit board 1. The above components are designed with different configurations and sizes to carry out different contact and test processes according to different specifications of various test apparatuses. Therefore, in general, each integrated circuit test apparatus necessitates a specific probe card and is incompatible with any other type of probe card.

However, the existent electronic products have more and more complicated combined functions. To keep up with this trend, the integrated circuit test apparatus must have stronger and stronger signal test capability to increase the test yield. For example, an original small-scale test apparatus with 256 test channels needs to be expanded to a large-scale test apparatus with 512 test channels.

In order to increase the signal test capability, some integrated circuit test service providers repurchase large-scale test apparatuses for increasing the test yield. Some other integrated circuit test service providers modify the software/hardware of the original small-scale test apparatuses to satisfy the demand for larger and larger test yield. Otherwise, the old small-scale test apparatuses will be inevitably laid up or washed out. This apparently leads to waste of resource. However, it will still cost the integrated circuit test service providers a lot of money to either repurchase new large-scale test apparatuses or modify the old small-scale test apparatuses.

Therefore, it is tried by the applicant to provide a probe card structure, which is convertible between different specifications by means of a specification conversion interface in adaptation to different specifications of test apparatuses. Accordingly, it is unnecessary to wash out the old small-scale test apparatuses. Moreover, all the test apparatuses can be more flexibly used to test the integrated circuits at higher efficiency and higher utilization.

SUMMARY OF THE INVENTION

It is therefore a primary object of the present invention to provide a probe card structure adaptable to different test apparatuses of different specifications. The probe card structure includes a layout circuit board adapted to a first specification, a reinforcement member adapted to a second specification and installable on a bed of a test apparatus of the second specification, and a specification conversion interface unit disposed between the layout circuit board and the reinforcement member. The specification conversion interface unit includes a specification conversion circuit board. The specification conversion circuit board has a first face facing the reinforcement member and a second face facing the layout circuit board. Multiple outer electrical connection sections adapted to the second specification are disposed on the first face corresponding to the test apparatus of the second specification. Multiple inner electrical connection sections adapted to the first specification are disposed on the second face corresponding to outer contacts of the layout circuit board. By means of the specification conversion interface unit, the probe card can be converted from the first specification to the second specification in adaptation to the test apparatus of the second specification. Accordingly, the probe card without the specification conversion interface unit can be directly mounted on a test apparatus of the first specification by means of a reinforcement member of the first specification to carry out the test process. Alternatively, the specification conversion interface unit can be combined with the probe card to convert the probe card from the first specification to the second specification, whereby the probe card of the second specification can be mounted on the test apparatus of the second specification by means of the reinforcement member of the second specification to carry out the test process. Accordingly, the probe card can be more flexibly applied to different test apparatuses of different specifications to test the integrated circuit at higher utilization.

In the above probe card structure, the specification conversion interface unit further includes an outer locating ring disposed on the second face of the specification conversion circuit board. An annular skirt section is formed along an outer circumference of the outer locating ring and protrudes toward the probe card. The specification conversion interface unit further includes an inner locating ring and a probe seat disposed within the annular skirt section of the outer locating ring. The inner locating ring is mounted on the second face of the specification conversion circuit board in a hollow defined by the outer locating ring, whereby the layout circuit board of the probe card can be easily and precisely mounted within the annular skirt section of the outer locating ring. Multiple connection circuits or contacts are arranged on the outer locating ring and the probe seat corresponding to the inner electrical connection sections of the specification conversion circuit board to electrically connect the outer contacts of the layout circuit board. Accordingly, by means of the specification conversion interface unit, the probe card can be converted between two specifications and more flexibly applied to different test apparatuses of different specifications to carry out the test process for integrated circuits.

The present invention can be best understood through the following description and accompanying drawings, wherein:

DETAILED DESCRIPTION OF THE PREFERRED EMBODIMENTS

Figure 1:
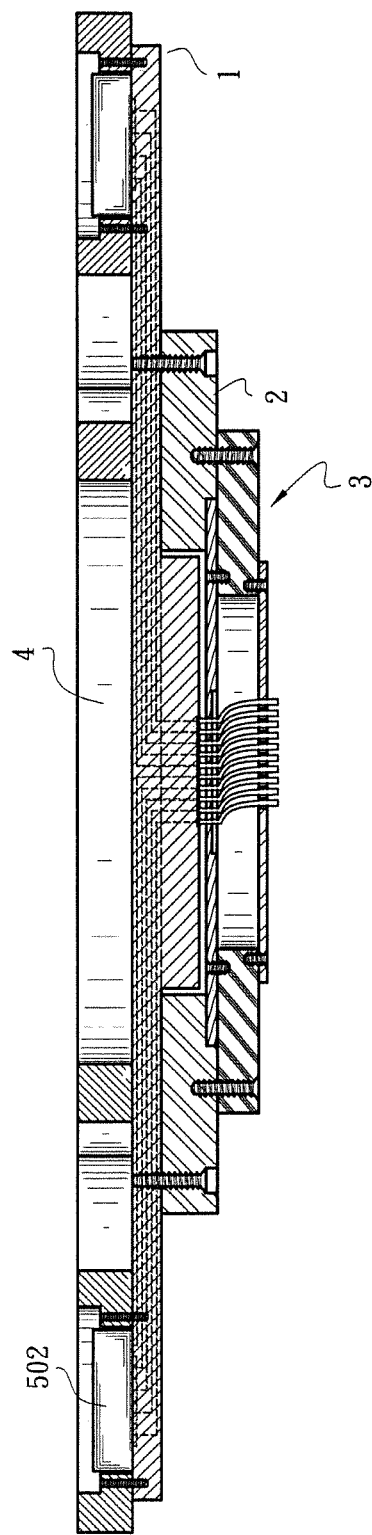
FIG. 1 is a sectional view of a conventional probe card of a first specification.
Figure 2:
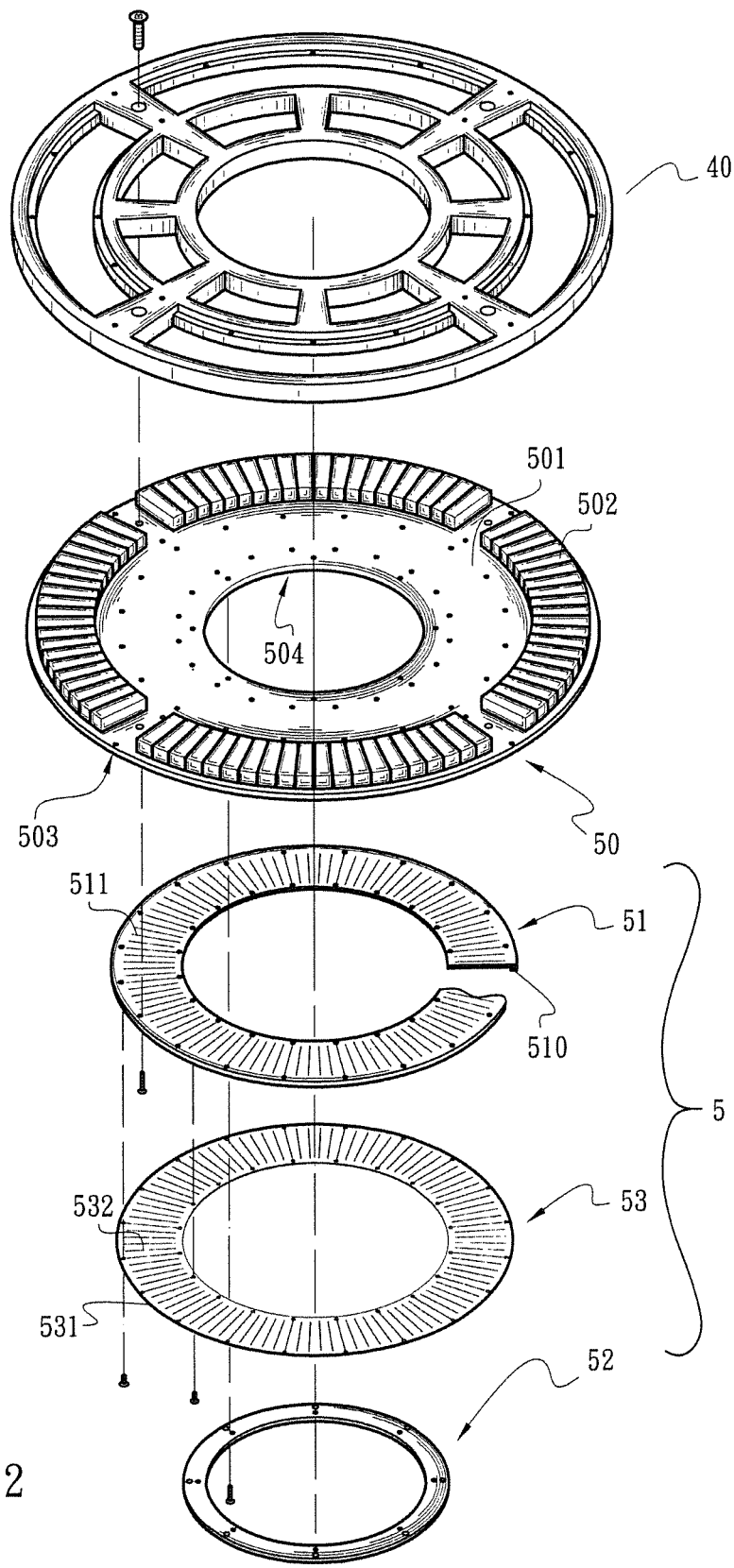
FIG. 2 is a perspective exploded view of the specification conversion interface unit and the reinforcement member of a preferred embodiment of the present invention.
Figure 3:
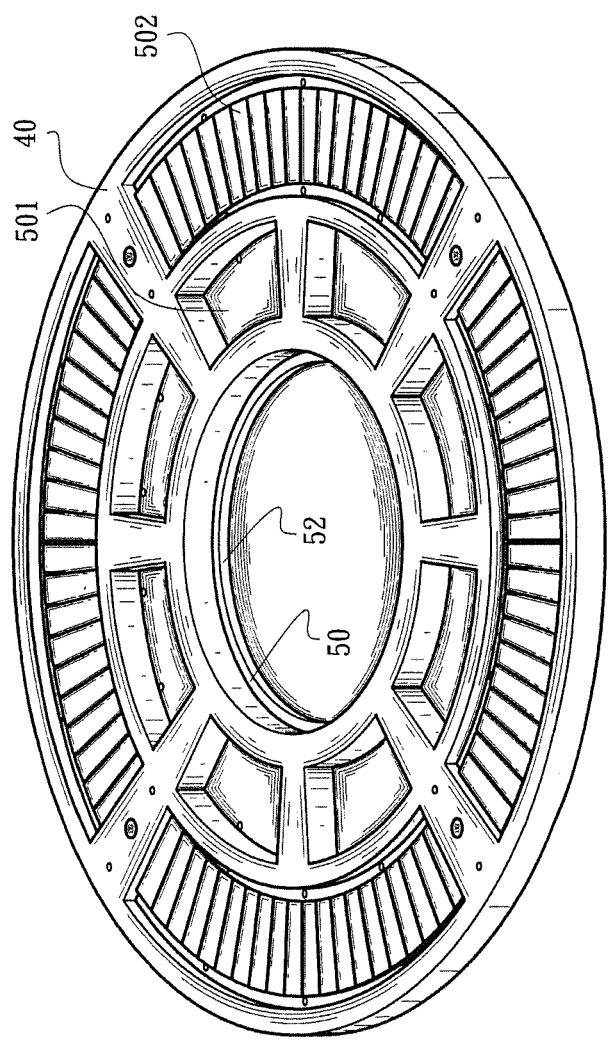
FIG. 3 is a perspective assembled view according to FIG. 2.
Figure 4:
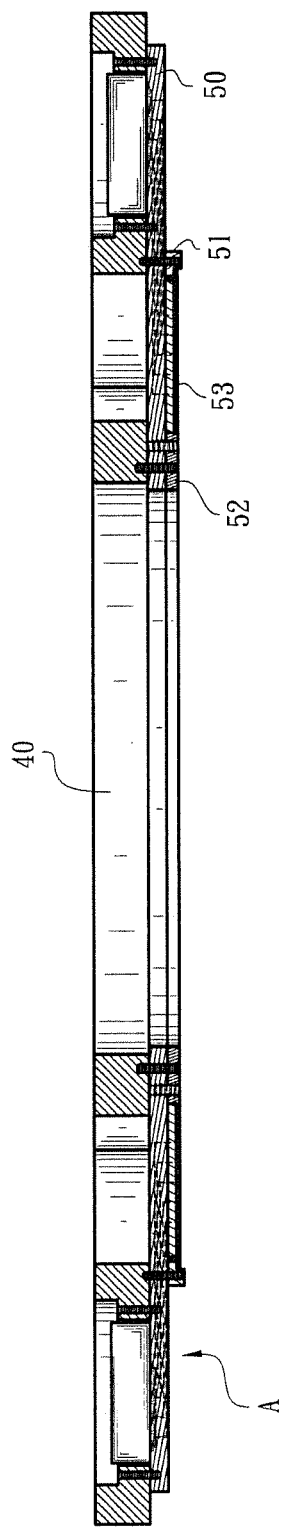
FIG. 4 is a sectional assembled view according to FIG. 3.
Figure 4A:
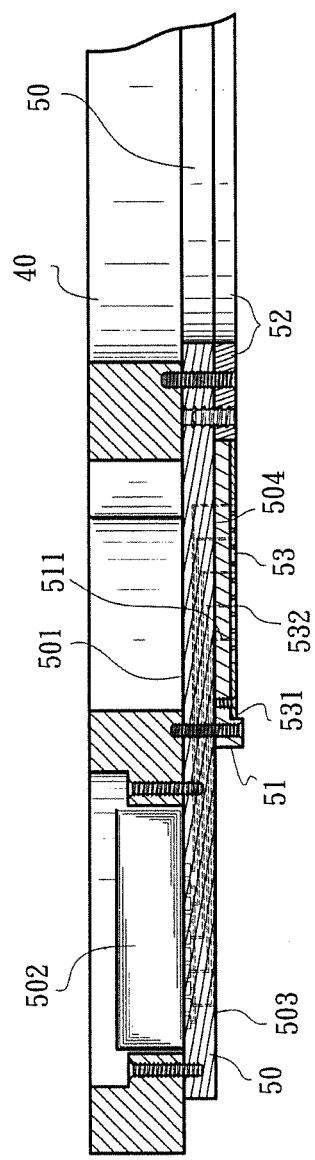
FIG. 4A is an enlarged view of area A of FIG. 4.

Please refer to FIGS. 2 to 5. The probe card structure of the present invention includes a layout circuit board 10 of a probe card adapted to a first specification (with reference to FIG. 5), a fastener ring 20, a probe retainer unit 30, a reinforcement member 40 adapted to a second specification and installable on a bed of a test apparatus of the second specification, and a specification conversion interface unit 5 disposed between the layout circuit board 10 and the reinforcement member 40. The specification conversion interface unit 5 is composed of a specification conversion circuit board 50, an outer locating ring 51, an inner locating ring 52 and a probe seat 53. The specification conversion circuit board 50 has a first face 501 facing the reinforcement member 40 adapted to the second specification of test apparatus and a second face 503 facing the layout circuit board 10. Multiple outer electrical connection sections 502 adapted to the second specification are disposed on the first face 501 corresponding to the test apparatus of the second specification. Multiple inner electrical connection sections 504 adapted to the first specification are disposed on the second face 503 corresponding to outer contacts 101 of the layout circuit board 10 of the first specification. The outer electrical connection sections 502 are respectively electrically connected with the inner electrical connection sections 504. The outer locating ring 51 is mounted on the second face 503 and directed to the layout circuit board 10. An annular skirt section 510 is formed along an outer circumference of the outer locating ring 51 and protrudes toward the probe card. Multiple connection circuits or contacts 511 adapted to the first specification are arranged on the outer locating ring 51 corresponding to the inner electrical connection sections 504 of the specification conversion circuit board 10 adapted to the first specification. The inner locating ring 52 is positioned in a hollow defined by the outer locating ring 51. The probe seat 53 has an outer circumference 531. The outer locating ring 51 has a face 512 facing the layout circuit board 10. The probe seat 53 is disposed on the face 512 of the outer locating ring 51 within the annular skirt section 510 with the outer circumference 531 in abutment with an inner circumference of the annular skirt section 510. Multiple connection circuits or contacts 532 adapted to the first specification are arranged on the probe seat 53 corresponding to the connection circuits or contacts 511 adapted to the first specification. Accordingly, the specification conversion circuit board 50, the outer locating ring 51, the inner locating ring 52 and the probe seat 53 are connected with each other to form the specification conversion interface unit 5 under the reinforcement member 40.

Figure 5:
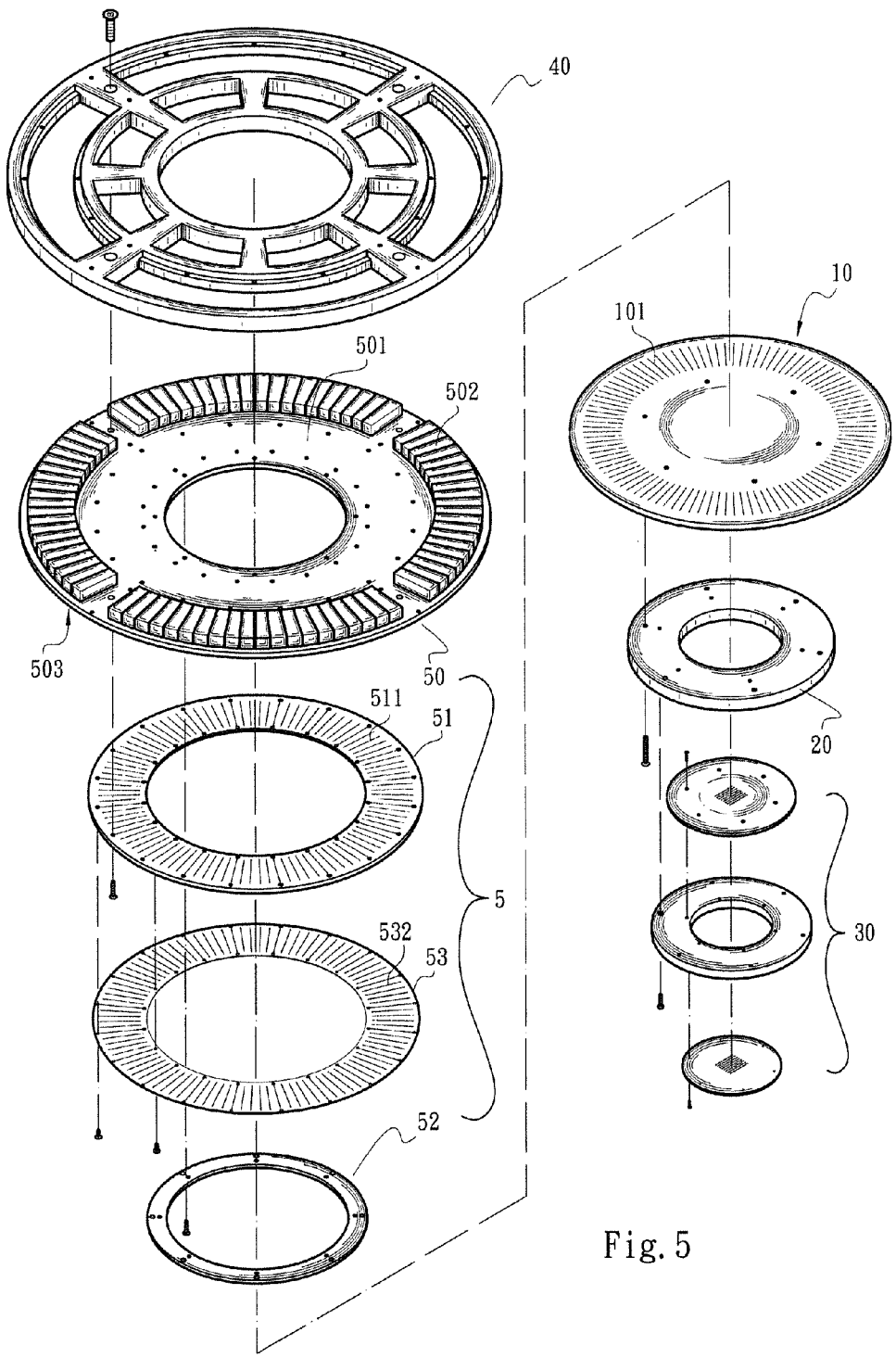
FIG. 5 is a perspective exploded view of the probe card structure of the present invention.
Figure 6:
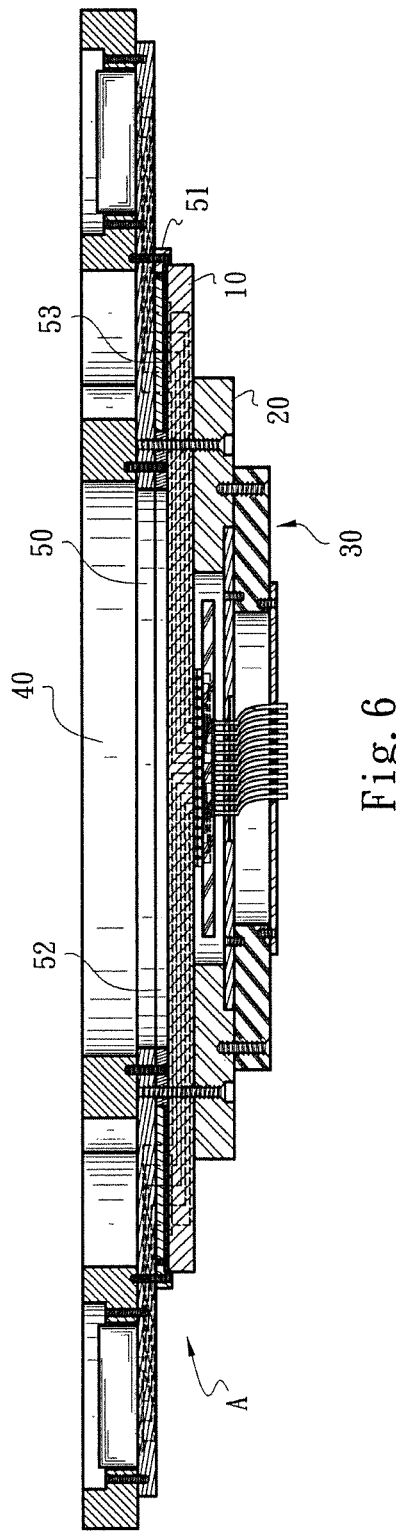
FIG. 6 is a sectional assembled view according to FIG. 5.
Figure 6A:
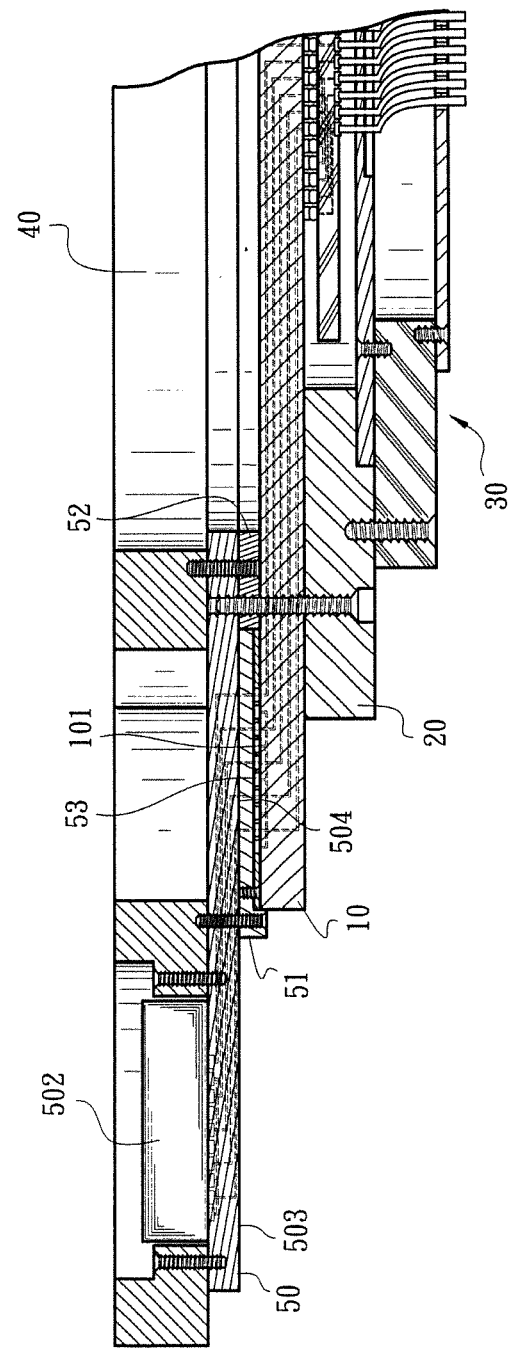
FIG. 6A is an enlarged view of area A of FIG. 6.

Please refer to FIGS. 5 to 6A. The outer contacts 101 of the layout circuit board 10 are arranged with the first specification in adaptation to the inner electrical connection sections 504 of the specification conversion circuit board 50 or the connection circuits or contacts 532 of the probe seat 53. The layout circuit board 10 is inlaid within the annular skirt section 510 of the outer locating ring 51 with its outer circumference in abutment with the inner circumference of the annular skirt section 510. The outer contacts 101 of the layout circuit board 10 are correspondingly electrically connected with the inner electrical connection sections 504 or the connection circuits or contacts 532, whereby the probe card is connected with the specification conversion interface unit 5. By means of the aforesaid reinforcement member 40 of the second specification, the probe card can be mounted on a test apparatus of the second specification corresponding to the outer electrical connection sections 502 of the specification conversion circuit board 50. Accordingly, by means of the specification conversion interface unit, the probe card is adapted to the test apparatus of the second specification, whereby the integrated circuit of the first specification can be tested with the test apparatus of the second specification.

Accordingly, the probe card of the first specification with the layout circuit board 10 can be directly mounted on a test apparatus of the first specification by means of a reinforcement member 40 of the first specification to carry out the test process as shown in FIG. 1. Alternatively, as shown in FIG. 6, the specification conversion interface unit 5 can be combined with the probe card of the first specification to convert the probe card from the first specification to the second specification. The probe card of the second specification then can be mounted on a test apparatus of the second specification by means of the reinforcement member 40 of the second specification to carry out the test process for the integrated circuit of the first specification. Accordingly, the test apparatus can be used to test the integrated circuit of the first specification. By means of the specification conversion interface unit 5, the probe card can be converted from the first specification to the second specification in adaptation to the test apparatus of the second specification. Accordingly, the test apparatus and the probe card can be more flexibly used to test the integrated circuit at higher utilization. Also, by means of the probe card structure of the present invention, the lifetime of old test apparatus with smaller test yield rate can be prolonged.

In conclusion, the probe card structure of the present invention is adaptable to different specifications of test apparatuses to save the cost and working time for manufacturing different specifications of probe cards.

The above embodiments are only used to illustrate the present invention, not intended to limit the scope thereof. Many modifications of the above embodiments can be made without departing from the spirit of the present invention.

What is claimed is:

1. A probe card structure adaptable to different test apparatuses of different specifications, comprising a layout circuit board configured according to a first specification of a first tester apparatus, and a reinforcement member configured according to a second specification of a second tester apparatus and a specification conversion interface unit conductively captured between the layout circuit board and the reinforcement member, the specification conversion interface unit having a first face facing the reinforcement member and a second face facing the layout circuit board, multiple outer electrical connection sections configured according to the second specification being disposed on the first face of the specification conversion interface unit and coupled to multiple inner electrical connection sections configured according to the first specification disposed on the second face of the specification conversion interface unit;

wherein the specification conversion interface unit at least includes a specification conversion circuit board, the specification conversion circuit board having a first face facing the reinforcement member and assembled therewith, and a second face facing the layout circuit board and assembled therewith.

2. The probe card structure adaptable to different test apparatuses of different specifications as claimed in claim 1, wherein the outer electrical connection sections adapted to the second specification are disposed on the first face of the specification conversion circuit board and the inner electrical connection sections adapted to the first specification are disposed on the second face of the specification conversion circuit board, the outer electrical connection sections being respectively electrically connected with the inner electrical connection sections.

3. The probe card structure adaptable to different test apparatuses of different specifications as claimed in claim 2, wherein the specification conversion interface unit further includes an outer locating ring of the first specification, the outer locating ring being mounted on the second face of the specification conversion circuit board and directed to the layout circuit board, an annular skirt section being formed along an outer circumference of the outer locating ring and protruding toward the layout circuit board.

4. The probe card structure adaptable to different test apparatuses of different specifications as claimed in claim 3, wherein the specification conversion interface unit further includes an inner locating ring, the inner locating ring being positioned on the second face of the specification conversion circuit board in a hollow defined by the outer locating ring.

5. The probe card structure adaptable to different test apparatuses of different specifications as claimed in claim 4, wherein the specification conversion interface unit further includes a probe seat, the outer locating ring having a face facing the layout circuit board, the probe seat being disposed on the face of the outer locating ring.

6. The probe card structure adaptable to different test apparatuses of different specifications as claimed in claim 4, wherein multiple connection circuits or contacts adapted to the first specification are arranged on the outer locating ring.

7. The probe card structure adaptable to different test apparatuses of different specifications as claimed in claim 4, wherein multiple outer contacts adapted to the first specification being arranged on the layout circuit board facing the specification conversion interface unit.

8. The probe card structure adaptable to different test apparatuses of different specifications as claimed in claim 5, wherein multiple connection circuits or contacts adapted to the first specification are arranged on the outer locating ring and multiple connection circuits or contacts adapted to the first specification are arranged on the probe seat corresponding to the connection circuits or contacts of the outer locating ring.

9. The probe card structure adaptable to different test apparatuses of different specifications as claimed in claim 5, wherein multiple outer contacts adapted to the first specification being arranged on the layout circuit board facing the specification conversion interface unit.

10. The probe card structure adaptable to different test apparatuses of different specifications as claimed in claim 6, wherein multiple outer contacts adapted to the first specification being arranged on the layout circuit board facing the specification conversion interface unit.

11. The probe card structure adaptable to different test apparatuses of different specifications as claimed in claim 3, wherein the specification conversion interface unit further includes a probe seat, the outer locating ring having a face facing the layout circuit board, the probe seat being disposed on the face of the outer locating ring.

12. The probe card structure adaptable to different test apparatuses of different specifications as claimed in claim 11, wherein multiple connection circuits or contacts adapted to the first specification are arranged on the outer locating ring and multiple connection circuits or contacts adapted to the first specification are arranged on the probe seat corresponding to the connection circuits or contacts of the outer locating ring.

13. The probe card structure adaptable to different test apparatuses of different specifications as claimed in claim 11, wherein multiple outer contacts adapted to the first specification being arranged on the layout circuit board facing the specification conversion interface unit.

14. The probe card structure adaptable to different test apparatuses of different specifications as claimed in claim 12, wherein multiple outer contacts adapted to the first specification being arranged on the layout circuit board facing the specification conversion interface unit.

15. The probe card structure adaptable to different test apparatuses of different specifications as claimed in claim 3, wherein multiple connection circuits or contacts adapted to the first specification are arranged on the outer locating ring.

16. The probe card structure adaptable to different test apparatuses of different specifications as claimed in claim 15, wherein multiple outer contacts adapted to the first specification being arranged on the layout circuit board facing the specification conversion interface unit.

17. The probe card structure adaptable to different test apparatuses of different specifications as claimed in claim 3, wherein multiple outer contacts adapted to the first specification being arranged on the layout circuit board facing the specification conversion interface unit.

18. The probe card structure adaptable to different test apparatuses of different specifications as claimed in claim 2, wherein multiple outer contacts adapted to the first specification being arranged on the layout circuit board facing the specification conversion interface unit.

19. The probe card structure adaptable to different test apparatuses of different specifications as claimed in claim 1, wherein the specification conversion interface unit further includes an outer locating ring of the first specification, the outer locating ring being mounted on the second face of the specification conversion circuit board and directed to the layout circuit board, an annular skirt section being formed along an outer circumference of the outer locating ring and protruding toward the layout circuit board.

20. The probe card structure adaptable to different test apparatuses of different specifications as claimed in claim 19, wherein the specification conversion interface unit further includes an inner locating ring, the inner locating ring being positioned on the second face of the specification conversion circuit board in a hollow defined by the outer locating ring.

21. The probe card structure adaptable to different test apparatuses of different specifications as claimed in claim 20, wherein multiple outer contacts adapted to the first specification being arranged on the layout circuit board facing the specification conversion interface unit.

22. The probe card structure adaptable to different test apparatuses of different specifications as claimed in claim 20, wherein the specification conversion interface unit further includes a probe seat, the outer locating ring having a face facing the layout circuit board, the probe seat being disposed on the face of the outer locating ring.

23. The probe card structure adaptable to different test apparatuses of different specifications as claimed in claim 22, wherein multiple connection circuits or contacts adapted to the first specification are arranged on the outer locating ring and multiple connection circuits or contacts adapted to the first specification are arranged on the probe seat corresponding to the connection circuits or contacts of the outer locating ring.

24. The probe card structure adaptable to different test apparatuses of different specifications as claimed in claim 22, wherein multiple outer contacts adapted to the first specification being arranged on the layout circuit board facing the specification conversion interface unit.

25. The probe card structure adaptable to different test apparatuses of different specifications as claimed in claim 20, wherein multiple connection circuits or contacts adapted to the first specification are arranged on the outer locating ring.

26. The probe card structure adaptable to different test apparatuses of different specifications as claimed in claim 25, wherein multiple outer contacts adapted to the first specifica- 27. The probe card structure adaptable to different test apparatuses of different specifications as claimed in claim 19, wherein the specification conversion interface unit further includes a probe seat, the outer locating ring having a face facing the layout circuit board, the probe seat being disposed on the face of the outer locating ring.

28. The probe card structure adaptable to different test apparatuses of different specifications as claimed in claim 27, wherein multiple connection circuits or contacts adapted to the first specification are arranged on the outer locating ring and multiple connection circuits or contacts adapted to the first specification are arranged on the probe seat corresponding to the connection circuits or contacts of the outer locating ring.

29. The probe card structure adaptable to different test apparatuses of different specifications as claimed in claim 28, wherein multiple outer contacts adapted to the first specification being arranged on the layout circuit board facing the specification conversion interface unit.

30. The probe card structure adaptable to different test apparatuses of different specifications as claimed in claim 27, wherein multiple outer contacts adapted to the first specification being arranged on the layout circuit board facing the specification conversion interface unit.

31. The probe card structure adaptable to different test apparatuses of different specifications as claimed in claim 19, wherein multiple connection circuits or contacts adapted to the first specification are arranged on the outer locating ring.

32. The probe card structure adaptable to different test apparatuses of different specifications as claimed in claim 31, wherein multiple outer contacts adapted to the first specification being arranged on the layout circuit board facing the specification conversion interface unit.

33. The probe card structure adaptable to different test apparatuses of different specifications as claimed in claim 19, wherein multiple outer contacts adapted to the first specification being arranged on the layout circuit board facing the specification conversion interface unit.

34. The probe card structure adaptable to different test apparatuses of different specifications as claimed in claim 1, wherein multiple outer contacts adapted to the first specification being arranged on the layout circuit board facing the specification conversion interface unit.

\* \* \* \* \*